United States Patent [19]

Matsuura et al.

[11] Patent Number: 4,555,702
[45] Date of Patent: Nov. 26, 1985

[54] REMOTE CONTROL SIGNAL REPRODUCING CIRCUIT

[75] Inventors: Shigeo Matsuura, Chigasaki; Uji Ito; Yasuhiro Yakushiji, both of Yokohama, all of Japan

[73] Assignee: Hitachi, Ltd., Tokyo, Japan

[21] Appl. No.: 418,254

[22] Filed: Sep. 15, 1982

[30] Foreign Application Priority Data

Sep. 17, 1981 [JP] Japan .............................. 56-145624

[51] Int. Cl.$^4$ .......................... H04Q 1/36; H03K 5/20
[52] U.S. Cl. ............................... 340/825.64; 328/109; 307/234
[58] Field of Search ........................ 340/825.63, 825.64, 340/825.65, 825.71; 328/109; 307/234

[56] References Cited

U.S. PATENT DOCUMENTS

| | | | |
|---|---|---|---|
| 3,686,634 | 8/1972 | Malchman et al. | 340/825.64 |
| 3,855,575 | 12/1974 | Leuschner et al. | 340/825.63 |
| 4,231,018 | 10/1980 | Imigawa et al. | 340/825.71 |

OTHER PUBLICATIONS

Rolf D. Burth, "Remote Control with MOS ICS for T.V. Sets", *IEEE Transactions on Consumer Electronics*, vol. CE-21, No. 4, Nov. 1975, pp. 311-319.

SAA 1050, SAA 1051, IC-Kit for Infrared Remote Control, Publication Order-No. 6251-110-2E, May 1978, ITT Semiconductors, pp. 1-22.

*Primary Examiner*—Donald J. Yusko
*Attorney, Agent, or Firm*—Antonelli, Terry & Wands

[57] ABSTRACT

A remote control signal reproducing circuit for use in a remotely-controlled receiver which receives a modulated transmission signal subjected to a pulse modulation, reproduces an original remote control signal form the received modulated transmission signal, and judges the reproduced remote control signal for effecting predetermined control operations based on pulse counts obtained during three predetermined successive time intervals.

A remote control signal is delivered if the pulse count obtained in the first time interval exceeds a first level. Judgement of the remote control signal is stopped when the number of pulses counted during the second and third time intervals is below or above predetermined numbers respectively. The circuit functions to eliminate noise pulse.

4 Claims, 6 Drawing Figures

REMOTE CONTROL SIGNAL REPRODUCING CIRCUIT

BACKGROUND OF THE INVENTION

This invention relates to a remote control signal reproducing circuit for a remotely-controlled receiver which is used for remote control of an apparatus, such as a television receiver set, by means of an intermittent infrared beam.

As shown in block form in FIG. 1, a prior art remotely-controlled receiver comprises a light receiving unit 1 adapted to receive a modulated transmission signal of an infrared beam and convert it into an electrical signal, an amplifier unit 2 adapted to amplify a small amplitude of the modulated transmission signal of a converted electrical form, a filter circuit 3 adapted to eliminate noise, a detector circuit 4 which detects the modulated transmission signal and reproduces therefrom a remote control signal, a waveform shaping circuit 5, and a signal demodulator circuit 6 mainly comprised of a digital circuit. See for example, the article "Remote Control With MOS ICs For TV Sets" in the IEEE Transactions on Consumer Electronics Vol. CE-21, No. 4, Nov. 1975, pp311-319 and the ITT pamphlet, SAA 1050 and SAA 1051, "IC-kit for Infrared Remote Control", May, 1978.

To explain the remote control signal and the modulated transmission signal, an infrared beam is subjected to a pulse position modulation so that a plurality of remote control signals are generated for controlling a plurality of functions in a remotely-controlled device of the television receiver set, and the remote control signals and the modulated transmission signal have waveforms as exemplified in FIG. 2.

Specifically, FIG. 2 illustrates by a waveform (a) a remote control signal constituted by pulses of an identical pulse width which are arrayed at uneven periods. For example, a pulse of 1 ms pulse width at a pulse period of 2 ms is defined to represent "0" and a pulse of the same pulse width at a pulse period of 4 ms is defined to represent "1" so that a remote control signal is constituted by a plurality of pulses. Five pulses as shown by the waveform (a) in FIG. 2 set up a remote control signal representative of "0010". A modulated transmission signal as shown by a waveform (b) in FIG. 2 is obtained by producing a signal modulated at several tens of KHz only when the pulses for the remote control signal as shown by the waveform (a) in FIG. 2 are present. The modulated transmission signal is applied to a light emitting unit comprised of, for example, an infrared light emitting diode (not shown), and transmitted to the remotely-controlled receiver so as to act as a switching signal for the infrared beam.

When the above remote control signal and the modulated transmission signal are used, various kinds of remote control signal can be prepared by increasing the number of pulses, thereby making it possible to control a number of functions.

The light receiving unit 1 in FIG. 1 receives an optical signal of an infrared beam and produces a modulated transmission signal of an electrical waveform shown by (b) in FIG. 2. The modulated transmission signal is amplified at the amplifier unit 2 and its noise component is removed by the filter unit 3. Since the filter has a retuning frequency tuned to a modulation frequency of several tens of KHz, the filter unit 3 produces an output signal as shown by a waveform (c) in FIG. 2. The output signal is then detected by the detector circuit 4 and the waveform shaping circuit 5 reproduces from a detected signal a remote control signal as shown by the waveform (a) of FIG. 2, which in turn is applied to the demodulator circuit 6.

A prior art detector circuit 4 comprised of a diode and an integrating circuit can operate normally when the modulated transmission signal has a sufficiently large amplitude and is substantially devoid of noise. However, the filter unit 3 sometimes fails to eliminate large noise resulting from natural light and infrared rays emitted from an electric lamp which interfere with the modulated transmission signal that travels over a long distance. In such a case, the waveform shaping circuit 5 cannot effect correct reproduction of a transmitted remote control signal, resulting in erroneous operations. Conversely, correct operations can be assured only for a remote control over a decreased distance.

Further, the detector circuit 4 comprised of the integrating circuit is difficult to form as an integrated circuit, requiring an increased number of components and raising the costs.

SUMMARY OF THE INVENTION

The present invention contemplates elimination of the prior art problems mentioned above and has for its object to provide a remote control signal reproducing circuit which is suitable for integration of a remotely-controlled receiver and is capable of correctly reproducing a transmitted remote control signal even when a modulated transmission signal travelling over a long distance is of an insufficient amplitude or has significant noise.

According to this invention, the above object can be accomplished by a remote control signal reproducing circuit wherein a first predetermined number of modulation signal pulses having a frequency of several tens of KHz contained in a modulated transmission signal is detected during a first predetermined time interval to judge that one pulse constituting a remote control signal has risen, the number of the modulation signal pulses which is not less than a second predetermined number is subsequently detected during a second predetermined time interval to judge that the one pulse of the remote control signal continues, and the number of the modulation signal pulses which is not more than a third predetermined number is subsequently detected during a third predetermined time interval to judge that the one pulse of the remote control signal has terminated, thus completing reproduction of the remote control signal.

The remote control signal reproducing circuit as a whole can be constituted by a digital logic circuit, and it can correctly reproduce the remote control signal from a modulated transmission signal containing a great number of noise impulses. By reproducing only the remote control signal and not the noise components of the modulated transmission signal, the present invention also effectively includes a noise rejection feature.

More specifically, with reference to FIG. 3 which illustrates with some exaggeration by means of waveforms (a) and (b) one pulse indicative of a remote control signal and a pulse train indicative of a modulated transmission signal associated with the one pulse, respectively, it will be seen that noise pulses occur outside the one pulse and the reception of normal modulation signal pulses is disturbed by noise interference so that some of the modulation signal pulses are missing in the one pulse.

For simplicity of explanation, assuming that the pulse of remote control signal has a width of 1 ms and the modulation frequency is 40 kHz, the normal modulated transmission signal contains 40 modulation signal pulses within a time interval of 1 ms.

A first measure for noise rejection or noise elimination is to determine that noise pulses other than the normal modulation signal pulses are not associated with the remote control signal pulse. Noise pulses are often in the form of impulses and it is not frequent that several noise pulses successively occur. On the other hand, since the normal modulation signal pulses are successive, the noise impulse can be discriminated and eliminated by counting the number of pulses occurring during a time interval of, for example, 0.1 ms and judging that the normal modulation signal pulses are present only when the number of counted pulses is not less than three.

In a second measure for noise rejection, the number of pulses following the three initial successive pulses and occurring within a time interval of, for example, 0.9 ms is counted and the occurring pulses are judged as noise when the number of counted pulses does not exceed a predetermined value. This second measure is based on the fact that occurrence of several successive noise pulses, which leads to erroneous judgement that the normal remote control signal pulse is started, cannot usually persist forever. In execution of the second measure, care should be taken of the fact that the normal modulation signal pulses are sometimes missing as shown by the wavefrom (b) in FIG. 3 if they are small in amplitude or where there is significant noise. Accordingly, for the number of the normal modulation signal pulses being 36 in this example, the number of pulses for judgement is set to, for example, 18 to cover the missing ones of the normal modulation signal pulses. By this measure, noise rejection and prolongation of the range of remote control can be assured.

A third measure for noise rejection is adapted to prevent erroneous operations caused not by impulse noise but by successive noise pulses. Under the application of successive noise pulses, occurrence of error pulses will persist even after the application of the above-mentioned second measure of noise rejection. On the other hand, the normal modulation signal pulses will not occur within a time interval of at least 1 ms following the termination of the remote control signal pulse. Thus, in the third measure, the number of pulses occurring after the termination of the remote control pulse is counted within a predetermined time interval and the occurring pulses are judged as successive noise signals when the number of counted pulses exceeds a predetermined value. The predetermined value is set to cover occurrence of impulse noise. For example, occurrence of 16 or more pulses within the 1 ms time interval is judged as occurrence of successive noise signals and the remote control operation is stopped.

The above three types of noise rejection measures can independently attain an advantageous effect but they can be combined to enhance the noise rejection effect.

In addition, the remote control signal reproducing circuit, based on any of the three measures wherein the number of pulses occurring within the predetermined time interval is counted for judgement of occurrence of noise pulses, can be constituted by a digital logic circuit which is easy to integrate. The three types of noise rejection measures have similarity in nature and circuit structures therefor have many common components so that they can be incorporated into a small-sized circuit.

Through the above noise rejection measures, a remote control signal as shown by a waveform (c) in FIG. 3 can be reproduced. Although the reproduced remote control signal has a pulse width which is narrowed by 0.1 ms, there arises no serious problem when the remote control signal form as shown by the waveform (a) in FIG. 2 is used.

DESCRIPTION OF PREFERRED EMBODIMENTS

Figure 1:
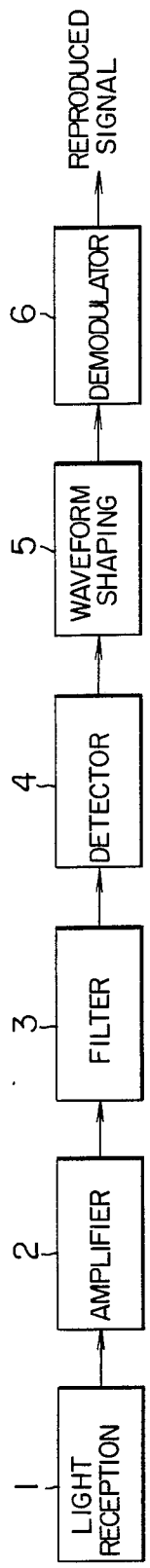
FIG. 1 is a block diagram of a prior art remotely-controlled receiver.
Figure 2:
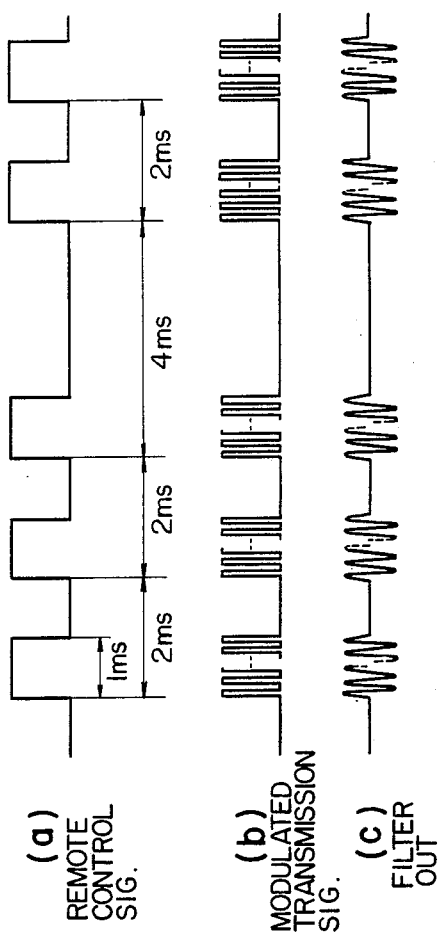
FIG. 2 is a waveform diagram showing a remote control signal, a modulated transmission signal and a filtered signal.
Figure 4:
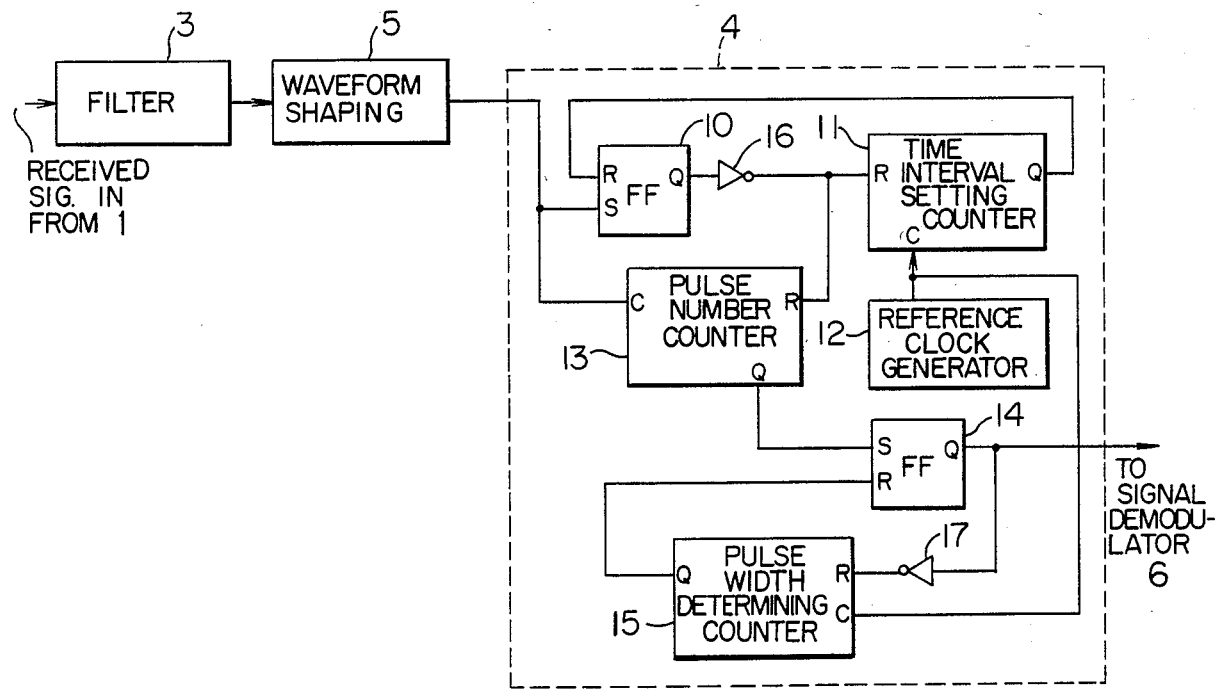
FIG. 4 is a block diagram of a first embodiment which is a remote control signal reproducing circuit for implementation of the first noise rejection measure according to the invention.

Referring now to FIG. 4, a first embodiment which is a remote control signal reproducing circuit for implementing the first noise rejection measure according to the invention will be described. The remote control signal reproducing circuit comprises a filter unit 3, a waveform shaping circuit 5, and a detector circuit (remote control signal discriminating circuit) 4. The detector circuit 4 includes RS flip-flops 10 and 14, a counter 11 for setting a time interval of 0.1 ms, a reference clock generator 12, a counter 13 for counting the number of pulses, a counter 15 for determining the width of a reproduced pulse, and inverters 16 and 17. The reproduced pulse is delivered from a terminal Q of the RS flip-flop 14 and sent to a signal demodulator circuit 6 as shown in FIG. 1.

When the pulse is delivered out of the waveform shaping circuit 5, the RS flip-flop 10 is set and its terminal Q delivers out an output of "1". Consequently, the inverter 16 delivers out an output of "0" which releases resetting of the counters 11 and 13, thereby causing the counter 11 to count output pulses of the reference clock generator 12. The counter 13 with its resetting now released, on the other hand, immediately starts counting pulses contained in a modulated transmission signal. The output from a terminal Q of the counter 11 is so set as to be "1" when 0.1 ms has elapsed after the release of resetting, and the output from a terminal Q of the counter 13 is so set as to be "1" when three pulses have been counted. Accordingly, if three or more pulses occur during the 0.1 ms time interval, the output from the terminal Q of counter 13 assumes "1" and the RS flip-flop 14 is set to produce an output of "1" at its terminal Q. This "1" output causes the counter 15 to count output pulses of the reference clock generator 12 and when 1 ms has elapsed after the start of counting, the output from a terminal Q of counter 15 assumes "1" to reset the RS flip-flop 14. Through the above operation, a remote control signal corresponding to the modulated transmission signal can be obtained at the terminal Q of the RS flip-flop 14.

On the other hand, when less than three pulses are received within the 0.1 ms time interval, the output from the terminal Q of counter 11 assumes "1" before the output from the terminal Q of counter 13 assumes "1", thereby resetting the RS flip-flop 10. As a result, the counter 13 is again reset to prevent the RS flip-flop 14 from being set. In this manner, random noise in the form of impulses can be eliminated.

Figure 3:
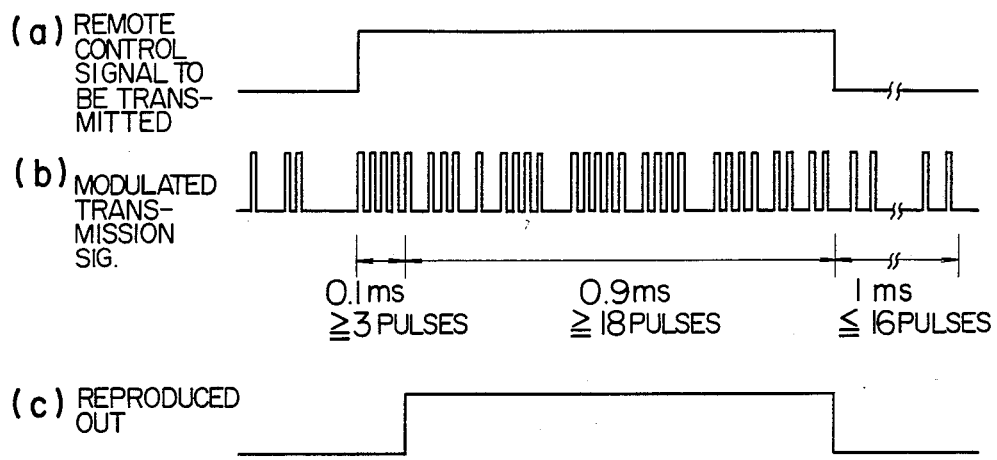
FIG. 3 is a waveform diagram useful in explaining the operation of a remote control signal reproducing circuit according to the invention.
Figure 5:
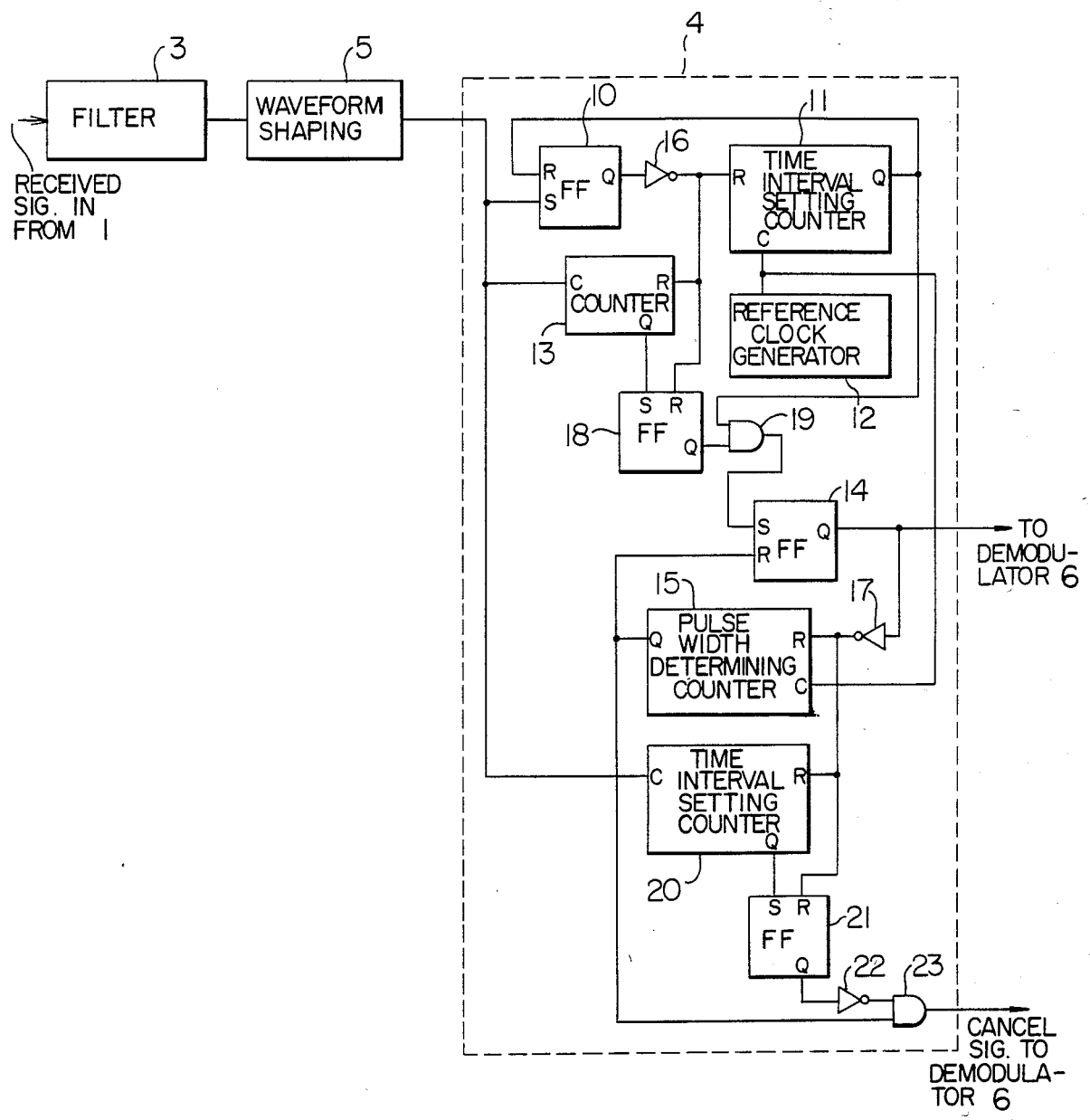
FIG. 5 is a block diagram of a second embodiment which is a remote control signal reproducing circuit for implementation of the first and second noise rejection measures according to the invention.

Reference is now made to FIG. 5 which illustrates a second embodiment wherein a circuit arrangement for implementing the second noise rejection measure is added to the circuit of FIG. 4 for implementing the first noise rejection measure. In this embodiment, however, the circuit for the first noise rejection measure is modified to meet timings shown in FIG. 3. In FIG. 5, there are further provided RS flip-flops 18 and 21, AND circuits 19 and 23, a counter 20 for counting the number of pulses in a time interval of 0.9 ms, and an inverter 22.

When three or more pulses are received during an initial time interval of 0.1 ms, the output from a terminal Q of a counter 13 assumes "1" before the output from a terminal Q of a counter 11 assumes "1", thereby setting the RS flip-flop 18. Under this condition, when 0.1 ms has elapsed, an RS flip-flop 14 receives a setting signal through the AND circuit 19 and produces an output of "1" at its terminal Q. This "1" level is kept until after a time interval of 0.9 ms determined by a counter 15 ends. In this manner, a remote control signal as shown by the waveform (c) in FIG. 3 can be reproduced.

The counter 20 counts the number of pulses during the 0.9 ms time interval and when 18 pulses have been counted, the output from a terminal Q of the counter 20 assumes "1" and the RS flip-flop 21 is set. Accordingly, even when the output from a terminal Q of the counter 15 assumes "1" after a lapse of 0.9 ms, the output of the AND circuit 23 remains "0".

On the other hand, when the number of pulses counted during the 0.9 ms time interval is below 18, the output from the terminal Q of counter 20 remains "0" and it follows that the RS flip-flop 21 is reset to produce an output of "0" at its terminal Q. Under this condition, when the output from the terminal Q of counter 15 assumes "1" after the lapse of 0.9 ms, the output of the AND circuit 23 assumes "1". Thus, this "1" output stops the subsequent operation of a signal demodulator circuit 6 to thereby prevent erroneous operations.

Figure 6:
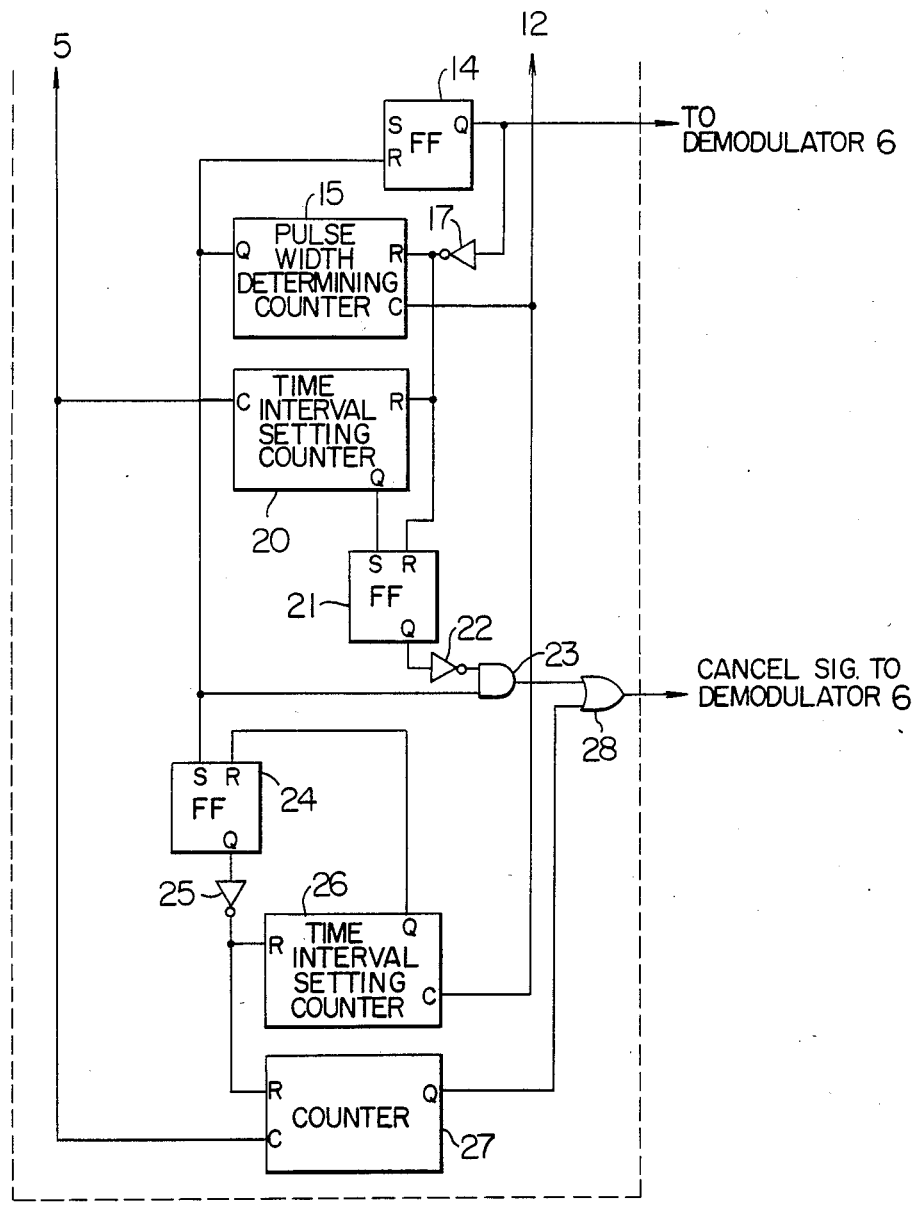
FIG. 6 is block diagram of a third embodiment which is a remote control signal reproducing circuit for implementation of the first, second and third noise rejection measures according to the invention.

FIG. 6 shows in block form a third embodiment wherein a circuit arrangement for implementing the third noise rejection measure is added to the circuit of FIG. 5 for implementing the first and second noise rejection measures. For simplify of illustration, the circuit arrangement for implementing the first noise rejection measure is not illustrated.

There are shown in FIG. 6, an RS flip-flop 24, an inverter 25, counters 26 and 27, and an OR circuit 28.

Since the output from a terminal Q of a counter 15 assumes "1" after counting of pulses during a time interval of 0.9 ms by the counter 15 has been completed, the RS flip-flop 24 is then set to cause the counters 26 and 27 to operate. The counter 26 is adapted to determine a time interval of 1 ms following the 0.9 ms time interval and whose output from its terminal Q assumes "1" after the lapse of 1 ms, thereby resetting the RS flip-flop 24 and the counter 27 as well.

If 16 or more pulses are received during the 1 ms time interval, the output from a terminal Q of the counter 27 assumes "1" and hence the OR circuit 28 produces an output of "1" which stops the operation of a signal demodulator circuit 6 to thereby prevent erroneous operations due to successive noise signals.

Although, in the remote control signal reproducing circuits described so far, a so-called "glitch" tends to take place if the timing slightly shifts, the glitch can be removed by applying usual, well known techniques to the logic circuit and the reproducing circuit modified to this end will not impair the effects of the present invention.

Further, separate counters are employed in the embodiments set forth so far for clarification of the three noise rejection measures but some of these counters may be commonly used therefor well known techniques.

As has been described, according to the invention, the remote control signal reproducing circuit can be constituted not by the prior art detector circuit which is difficult to integrate but by the digital logic circuit, and the correct remote control signal can be reproduced from the modulated transmission signal containing a number of impulse noise signals and erroneous operations due to successive noise signals can be prevented by detecting that the number of pulses contained in the modulated transmission signal is not less than the first predetermined number during the initial predetermined time interval, detecting that the number of pulses is not less than the second predetermined number during the subsequent predetermined time interval, and detecting that the number of pulses is not more than the third predetermined number during the further subsequent time interval.

The remote control reproducing circuit which is easy to be formed in an integrated circuit can advantageously be materialized at low cost.

We claim:
1. A signal reproducing circuit comprising:
an input terminal for receiving a modulated transmission signal subjected to a pulse modulation;
at least one of first, second and third noise rejection means for eliminating noise from the modulated transmission signal received by said input terminal; and
an output terminal to which a reproduced output signal reproduced from the modulated transmission signal removed of noise by said noise rejection means is delivered,
said first noise rejection means including;
first time setting means connected between said input terminal and said output terminal, for setting a first predetermined time interval starting from a time at which an initial pulse of said modulated transmission signal is received by said input terminal, and
first pulse counting means coupled to said first time setting means, for counting the number of the pulses received by said input terminal during said first predetermined time interval and allowing the reproduced output signal to be delivered to said output terminal when the number of the counted pulses exceeds a first predetermined number,
said second noise rejection means including;

second time setting means connected between said input terminal and said output terminal, for setting a second predetermined time interval following lapse of said first predetermined time interval, and second pulse counting means coupled to said second time setting means, for counting the number of the pulses received by said input terminal during said second predetermined time interval and preventing delivery of the reproduced output signal to said output terminal when the number of the counted pulses is below a second predetermined number, said third noise rejection means including;

third time setting means connected between said input terminal and said output terminal, for setting a third predetermined time interval following lapse of said second predetermined time interval and third pulse counting means coupled to said third time setting means, for counting the number of the pulses received by said input terminal during said third predetermined time interval and preventing delivery of the reproduced output signal to said output terminal when the number of the counted pulses exceeds a third predetermined number.

2. The signal reproducing circuit according to claim 1, wherein said modulated transmission signal includes a remote control signal formed of carrier pulses having a frequency at least several tens of times higher than that of said remote control signal.

3. The signal reproducing circuit according to claim 2, wherein said first and second predetermined time intervals totally are substantially equal to the pulse width of a unit remote control signal, said first predetermined time interval being substantially smaller than said second predetermined time interval and said third predetermined time interval is substantially equal to said pulse width of a unit remote control signal.

4. The signal reproducing circuit according to claim 3, said second predetermined number in the second noise rejection means is set to be smaller than a normal number of carrier pulses sufficiently to mask missing carrier pulses.

* * * * *